United States Patent
Song et al.

(10) Patent No.: US 11,804,254 B2
(45) Date of Patent: Oct. 31, 2023

(54) MEMORY DEVICE AND METHOD OF REFRESHING MEMORY DEVICE BASED ON TEMPERATURE

(71) Applicant: SAMSUNG ELECTRONICS CO., LTD., Suwon-si (KR)

(72) Inventors: Saemi Song, Busan (KR); Dokyun Kim, Seongnam-si (KR); Yeonkyu Choi, Seoul (KR); Doohee Hwang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 17/529,900

(22) Filed: Nov. 18, 2021

(65) Prior Publication Data

US 2022/0199150 A1 Jun. 23, 2022

(30) Foreign Application Priority Data

Dec. 23, 2020 (KR) .................. 10-2020-0182424

(51) Int. Cl.
*G11C 11/406* (2006.01)

(52) U.S. Cl.
CPC .. *G11C 11/40626* (2013.01); *G11C 11/40615* (2013.01); *G11C 11/40622* (2013.01)

(58) Field of Classification Search
CPC ........ G11C 11/40626; G11C 11/40615; G11C 11/40622
See application file for complete search history.

(56) References Cited

U.S. PATENT DOCUMENTS

| | | | |
|---|---|---|---|
| 7,109,548 B2 | 9/2006 | Forbes et al. | |
| 7,280,386 B2 | 10/2007 | Klein | |
| 7,489,580 B2 | 2/2009 | Ito et al. | |
| 8,122,187 B2 | 2/2012 | Walker | |
| 8,300,488 B2 | 10/2012 | Pyeon | |
| 8,797,818 B2 | 8/2014 | Jeddeloh | |
| 9,342,443 B2 | 5/2016 | Walker et al. | |
| 9,368,187 B2 * | 6/2016 | Dong | G11C 11/40611 |
| 9,384,818 B2 | 7/2016 | Adelman et al. | |
| 9,633,711 B2 * | 4/2017 | Cho | G11C 7/1072 |
| 9,875,785 B2 | 1/2018 | Jose et al. | |
| 10,529,406 B2 * | 1/2020 | Choi | G11C 11/4078 |
| 11,031,066 B2 * | 6/2021 | He | G11C 11/40622 |
| 2022/0147277 A1 * | 5/2022 | Oh | G11C 11/40626 |

FOREIGN PATENT DOCUMENTS

KR  1020070042540  4/2007

* cited by examiner

*Primary Examiner* — Son L Mai
(74) *Attorney, Agent, or Firm* — F. Chau & Associates, LLC

(57) ABSTRACT

Provided are a memory device and a method of refreshing the memory device regardless of a refresh rate multiplier for a temperature. In response to a refresh command at each base refresh rate (tREFi) based on a measured temperature, a memory device refreshes M memory cell rows at room temperature, refreshes 2M memory cell rows at a high temperature, and refreshes (½)M memory cell rows at a low temperature. The memory device refreshes (n+1)*M memory cell rows at a base refresh rate tREFi in response to a refresh command applied after n skipped base refresh rates, and refreshes (n+1)*M memory cell rows at a base refresh rate tREFi in response to a pulling-in refresh command.

18 Claims, 9 Drawing Sheets

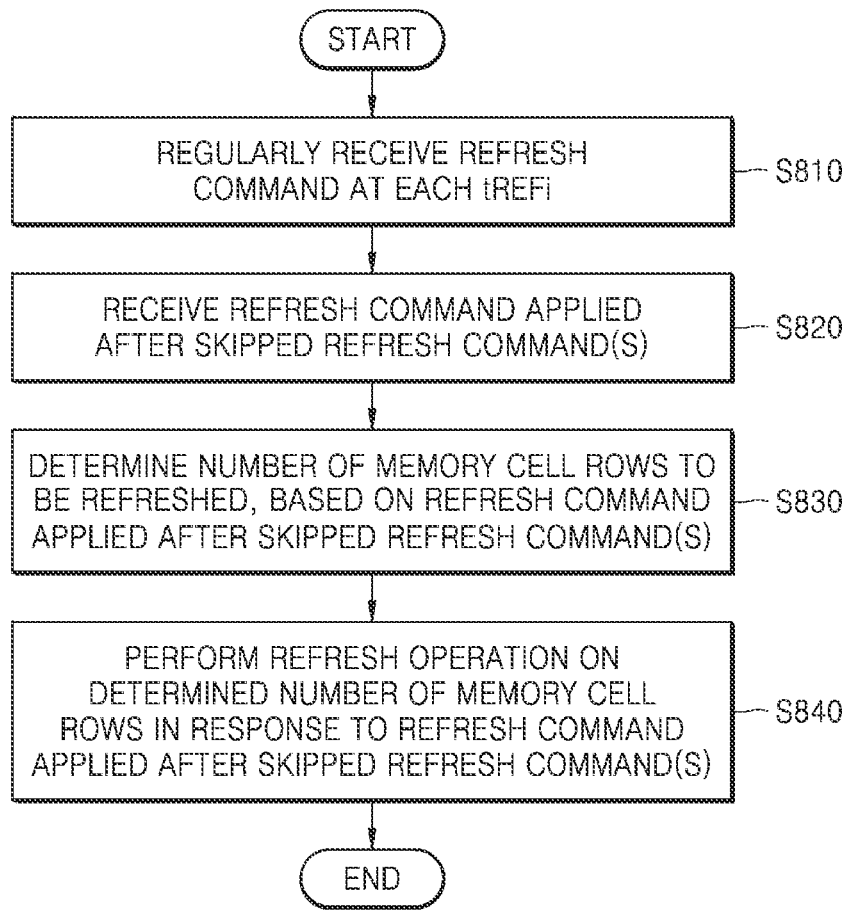
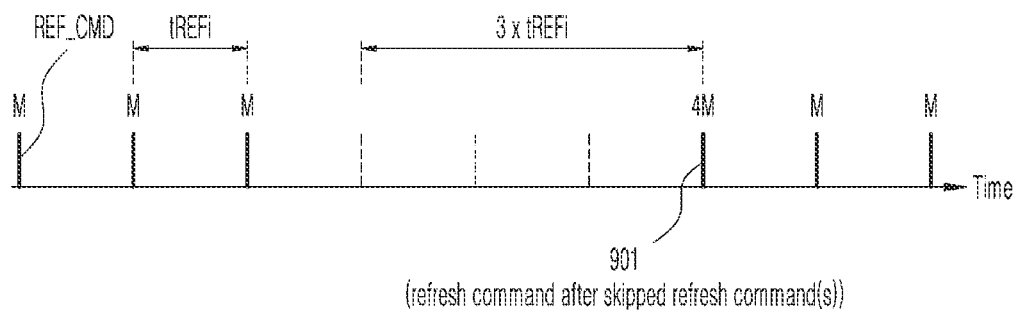

MEMORY DEVICE AND METHOD OF REFRESHING MEMORY DEVICE BASED ON TEMPERATURE

CROSS-REFERENCE TO RELATED APPLICATION

This U.S. non-provisional patent application claims priority under 35 U.S.C. § 119 to Korean Patent Application No. 10-2020-0182424, filed on Dec. 23, 2020, in the Korean Intellectual Property Office, the disclosure of which is incorporated by reference in its entirety herein.

TECHNICAL FIELD

The inventive concept relates to a memory device, and more particularly, to a method of refreshing the memory device based on temperature.

DISCUSSION OF RELATED ART

A system including semiconductor chips typically uses dynamic random access memory (DRAM) as an operation memory or a main memory to store data or instructions used by a host and/or to perform a computational operation. In general, the DRAM may write data or read written data via control of the host. When the computational operation is performed, the host may retrieve instructions and/or data from the DRAM and use data to execute the instructions and/or to perform the computational operation. The host may write back the result of the computational operation to the DRAM.

The system may control a refresh operation of the DRAM during the operations described above. The DRAM may refresh the memory cell rows in response to a periodically applied refresh command. DRAM cells may be refreshed by reading all memory cell rows of the DRAM at a regularly given refresh rate tREF. A DRAM cell may exhibit variable data retention characteristics according to temperature. The refresh rate tREF may be set short at a high temperature, and may be set long at a low temperature.

In the joint electron device engineering council (JEDEC) standard, a refresh rate is defined according to a refresh rate multiplier expressed as a function of a DRAM temperature. The refresh rate multiplier may range from (⅛) times a base refresh rate (i.e., 1×) to 8 times the base refresh rate (i.e., 8×). For example, the base refresh rate (i.e., 1×) may be set to a certain number of refresh commands in a certain refresh window.

The system may change a refresh period to correspond to a refresh rate specified by the refresh rate multiplier. The system has to adjust a system clock rate in association with the changed refresh period. However, issuing a refresh command while changing the system clock rate may lead to a scheduling and/or switching burden between tasks.

SUMMARY

At least one embodiment of the inventive concept provides a method of refreshing a memory device, in which the number of memory cells to be refreshed is adaptively varied according to a temperature, the memory device, and a memory system.

According to an exemplary embodiment of the inventive concept, there is provided a memory device including a memory cell array including a plurality of memory cell rows, and a refresh control circuit configured to perform a refresh operation on the plurality of memory cell rows in response to a refresh command. The refresh control circuit regularly receives the refresh command at each base refresh rate. The refresh control circuit determines a number of memory cell rows to be refreshed based on a temperature of the memory device, and refreshes the determined number of memory cell rows from among the plurality of memory cell rows, during a base refresh period associated with the base refresh rate, in response to the refresh command.

According to exemplary embodiment of the inventive concept, there is provided a memory device including a memory cell array including a plurality of memory cell rows and a refresh control circuit. The refresh control circuit performs a refresh operation on the plurality of memory cell rows in response to a refresh command. The refresh control circuit regularly receives the refresh command at each base refresh rate. The refresh control circuit receives the refresh command at the base refresh rate applied after n (n is a natural number) base refresh rates are skipped, determines a number of memory cell rows to be refreshed based on the refresh command applied after the n skipped base refresh rates, and refreshes the determined number of memory cell rows from among the plurality of memory cell rows, during a base refresh period associated with the base refresh rate, in response to the refresh command applied after the n skipped base refresh rates.

According to exemplary embodiment of the inventive concept, there is provided a memory device including a memory cell array including a plurality of memory cell rows and a refresh control circuit configured to perform a refresh operation on the plurality of memory cell rows in response to a refresh command. The refresh control circuit regularly receives the refresh command at each base refresh rate. The refresh control circuit receives a pulling-in refresh command, skips n (n is a natural number) base refresh rates after receiving the pulling-in refresh command, determines a number of the memory cell rows to be refreshed, in response to the pulling-in refresh command, and refreshes the determined number of memory cell rows, from among the plurality of memory cell rows, during a base refresh period associated with the base refresh rate, in response to the pulling-in refresh command.

According to an exemplary embodiment of the inventive concept, there is provided a memory device including a memory cell array including a plurality of memory cell rows, and a refresh control circuit configured to perform a refresh operation on the plurality of memory cell rows in response to a refresh command. The refresh control circuit is configured to regularly receive the refresh command at each base refresh rate. The refresh control circuit receives a refresh command within the base refresh rate, skips n base refresh rates after the refresh command within the base refresh rate (n is a natural number), determines a number of the memory cell rows to be refreshed, in response to the refresh command within the base refresh rate, and refreshes the determined number of memory cell rows from among the plurality of memory cell rows, during a base refresh period associated with the base refresh rate, in response to the refresh command within the base refresh rate.

According to an exemplary embodiment of the inventive concept, there is provided a memory system including a memory controller configured to regularly issue a refresh command at each base refresh rate, and a memory device including a plurality of memory cell rows. The memory device is configured to perform a refresh operation on the plurality of memory cell rows in response to the refresh command. The memory device determines a number of the memory cell rows to be refreshed based on a temperature of the memory device, and refreshes the determined number of memory cell rows from among the plurality of memory cell rows, during a base refresh period associated with the base refresh rate, in response to the refresh command.

According to an exemplary embodiment of the inventive concept, there is provided a method of refreshing a memory device including a plurality of memory cell rows. The method includes measuring a temperature of the memory device, regularly receiving a refresh command at each base refresh rate, and performing a first refresh operation on the plurality of memory cell rows, in response to the refresh command. The first refresh operation includes determining a number of the memory cell rows to be refreshed based on the measured temperature, and refreshing the determined number of memory cell rows from among the plurality of memory cell rows, during a base refresh period associated with the base refresh rate, according to the refresh command.

BRIEF DESCRIPTION OF THE DRAWINGS

Embodiments of the inventive concept will be more clearly understood from the following detailed description taken in conjunction with the accompanying drawings in which:

FIG. 8 is a flowchart of an example of a refresh operation of a memory device according to an exemplary embodiment of the inventive concept;

FIG. 9 is a timing diagram illustrating refresh operations performed based on the flowchart of FIG. 8;

DETAILED DESCRIPTION OF THE EMBODIMENTS

Figure 1:
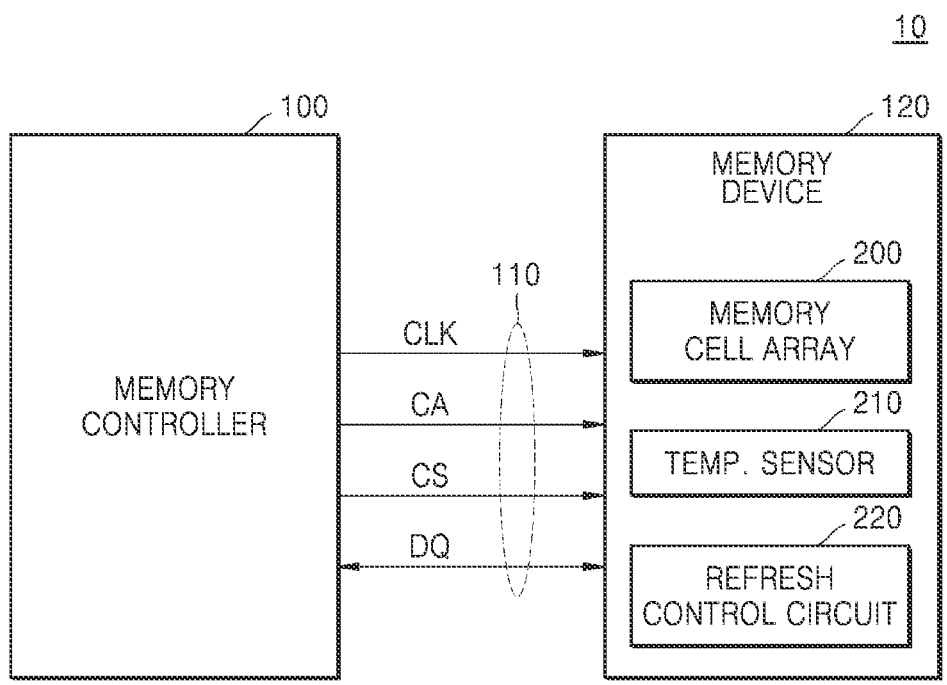
FIG. 1 is a block diagram of a memory system including a memory device according to an exemplary embodiment of the inventive concept.

FIG. 1 is a block diagram of a memory system 10 including a memory device 120 according to an exemplary embodiment of the inventive concept.

Referring to FIG. 1, the memory system 10 includes a memory controller 100 and the memory device 120. The memory system 10 may refer to an integrated circuit (IC), an electronic device or system, a smartphone, a computing device such as a tablet personal computer (PC), a computer, a server, a workstation, a portable communication terminal, a personal digital assistant (PDA), a portable multimedia player (PMP), and other appropriate computers, a virtual machine, or a virtual computing device thereof. Alternatively, the memory system 10 may correspond to a component (e.g., a graphics card) included in a computing system. In some embodiments, the memory system 10 may be implemented as an unbuffered dual in-line memory module (UDIMM), a registered DIMM (RDIMM), a load reduced DIMM (LRDIMM), a fully buffered DIMM (FBDIMM), or a small outline DIMM (SODIMM).

The memory controller 100 may be communicatively connected to the memory device 120 through a memory bus 110. The memory controller 100 may control the memory device 120 according to initialization and/or operation characteristics of the memory device 120. The memory controller 100 may be directly connected mainly to a central processing unit (CPU). In another embodiment, the memory controller 100 may be manufactured as a portion of the CPU.

A memory PHY including a physical or electrical layer and a logical layer may be provided for signals, frequencies, timing, driving, detailed operation parameters, and functionality, which are required for efficient communication between the memory controller 100 and the memory device 120. The memory PHY may support characteristics of a double data rate (DDR) protocol and/or low-power DDR (LPDDR) protocol of a joint electron device engineering council (JEDEC) standard.

The memory PHY may be connected to the memory controller 100 and the memory device 120 through the memory bus 110. For clarity, a clock signal CLK, command/address CA, and data DQ are illustrated as being provided through one signal line between the memory controller 100 and the memory device 120, but a clock signal CLK, command/address (CA), and data DQ may be provided through a plurality of signal lines or a bus. Signal lines between the memory controller 100 and the memory device 120 may be connected through connectors. The connectors may be implemented as pins, balls, signal lines, or other hardware components.

The clock signal CLK may be transmitted from the memory controller 100 to the memory device 120 through a clock signal line of the memory bus 110. The CA signal may be transmitted from the memory controller 100 to the memory device 120 through a CA bus of the memory bus 110. A chip selection (CS) signal may be transmitted from the memory controller 100 to the memory device 120 through a CS line of the memory bus 110. A CS signal, which is activated to logic high, may indicate that the CA signal transmitted through the CA bus is a command. The data DQ may be transmitted from the memory controller 100 to the memory device 120 or transmitted from the memory device 120 to the memory controller 100 through a data (DQ) bus of the memory bus 110 including bi-directional signal lines.

The memory device 120 may write or read data DQ via the control of the memory controller 100 and perform a refresh operation. As an example, the memory device 120 may include dynamic random access memory (DRAM), synchronous DRAM (SDRAM), DDR SDRAM, LPDDR SDRAM, or graphics double data rate (GDDR) SDRAM. In an embodiment, the memory device 120 includes a memory cell array 200, a temperature sensor 210, and a refresh control circuit 220.

The memory cell array 200 may include a plurality of word lines, a plurality of bit lines, and a plurality of memory cells formed at intersections between the word lines and the bit lines. The memory cells of the memory cell array 200 may be volatile memory cells, for example, DRAM cells.

The temperature sensor 210 may measure a temperature of the memory device 120. The temperature sensor 210 may provide the measured temperature to the refresh control circuit 220. For example, the temperature sensor 210 may include a thermal resistor or a thermocouple.

The refresh control circuit 220 may control the refresh operation on the memory cell array 200 in response to a refresh command provided by the memory controller 100 based on the temperature measured by the temperature sensor 210. The refresh control circuit 220 may change the number of memory cell rows to be refreshed, during a base refresh period associated with a base refresh rate tREFi, based on the measured temperature. In an exemplary embodiment, in response to the refresh command at each base refresh rate tREFi, the refresh control circuit 220 refreshes M (M is a natural number) memory cell rows at room temperature, refreshes 2M memory cell rows at a hot temperature, and refreshes (½)M memory cell rows at a cold temperature. In an embodiment, the memory controller 100 does not vary the base refresh rate according to a refresh rate multiplier, based on the temperature of the memory device 120.

The refresh control circuit 220 may control a refresh operation on the memory cell array 200 in response to a pulling-in refresh command provided by the memory controller 100 at a base refresh rate, a refresh command applied after skipped refresh command(s), or a refresh command within the base refresh rate. In an embodiment, the refresh control circuit 220 receives a refresh command at a next base refresh rate after n (n is a natural number) base refresh rates are skipped, refreshes (n+1)*M memory cell rows in response to the refresh command applied after the n skipped base refresh rates, and refreshes M memory cell rows in response to a refresh command at each base refresh rate after the refresh command applied after the n skipped base refresh rates. The refresh control circuit 220 may receive a pulling-in refresh command at a base refresh rate, skip n base refresh rates after the pulling-in refresh command, refresh (n+1)*M memory cell rows in response to the pulling-in refresh command, and refresh M memory cell rows in response to a refresh command at each base refresh rate after the pulling-in refresh command. The refresh control circuit 220 may receive a refresh command within a base refresh rate, skip n base refresh rates after the refresh command within the base refresh rate, refresh (n+1)*M memory cell rows in response to the refresh command within the base refresh rate, and refresh M memory cell rows in response to a refresh command at each base refresh rate after the refresh command within the base refresh rate.

Figure 2:
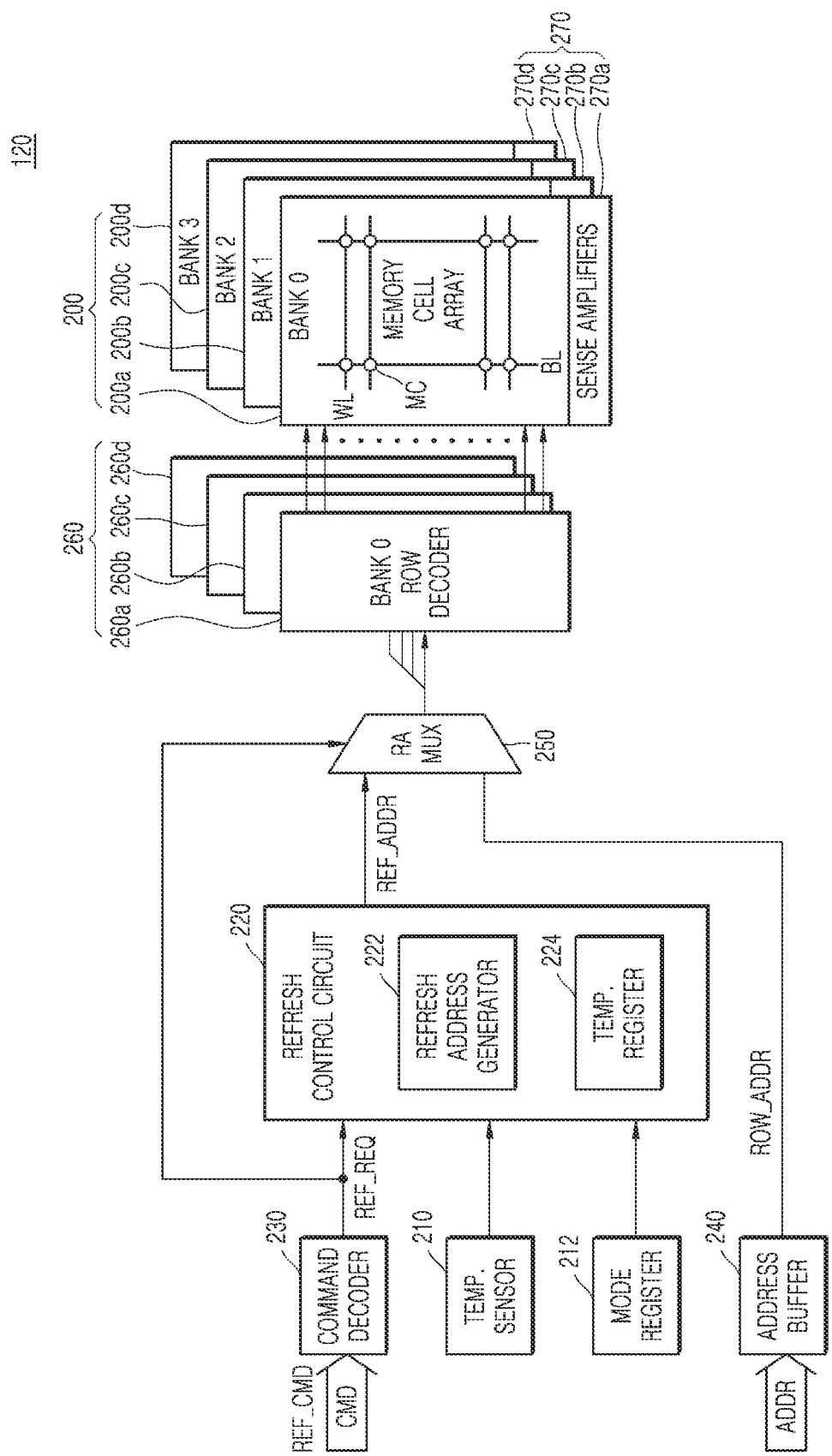
FIG. 2 is a block diagram of a memory device according to an exemplary embodiment of the inventive concept.

FIG. 2 is a block diagram of the memory device 120 according to an exemplary embodiment of the inventive concept. Although a plurality of hardware configurations included in the memory device 120 are illustrated in FIG. 2, the memory device 120 is not limited thereto and may have other configurations.

Referring to FIGS. 1 and 2, the memory device 120 includes the memory cell array 200, the temperature sensor 210, a mode register 212, the refresh control circuit 220, a command decoder 230 (e.g., a decoder circuit), an address buffer 240, a row address multiplexer 250, a row decoder 260 (e.g., a decoder circuit), and a sense amplifier unit 270.

The memory cell array 200 may include first to fourth bank arrays 200*a*, 200*b*, 200*c*, and 200*d*. Each of the first to fourth bank arrays 200*a*, 200*b*, 200*c*, and 200*d* may include a plurality of memory cells MC, which are arranged in rows and columns in a matrix form. Each of the first to fourth bank arrays 200*a*, 200*b*, 200*c*, and 200*d* may include a plurality of word lines WL and a plurality of bit lines BL, which are connected to the memory cells MC. The plurality of word lines WL may be connected to rows of memory cells MC, and the plurality of bit lines BL may be connected to columns of memory cells MC. A row of memory cells MC connected to one word line WL may be referred to as a memory cell row. In the following embodiments, the word line WL and the memory cell row may be used interchangeably.

The row decoder 260 may include first to fourth bank row decoders 260*a*, 260*b*, 260*c*, and 260*d*, which are respectively connected to the first to fourth bank arrays 200*a*, 200*b*, 200*c*, and 200*d*. Each of the first to fourth bank row decoders 260*a*, 260*b*, 260*c*, and 260*d* may receive a row address ROW_ADDR of a corresponding bank from the address buffer 240 or receive a refresh row address REF_ADDR from the refresh control circuit 220. The first to fourth bank row decoders 260*a*, 260*b*, 260*c*, and 260*d* may decode the row address ROW_ADDR or the refresh row address REF_ADDR and activate a word line WL corresponding to the row address ROW_ADDR or the refresh row address REF_ADDR. For example, the first to fourth bank row decoders 260*a*, 260*b*, 260*c*, and 260*d* may apply a word line driving voltage to the activated word line WL.

The sense amplifier unit 270 may include first to fourth bank sense amplifiers 270*a*, 270*b*, 270*c*, and 270*d*, which are respectively connected to the first to fourth bank arrays 200*a*, 200*b*, 200*c*, and 200*d*. The first to fourth bank sense amplifiers 270*a*, 270*b*, 270*c*, and 270*d* may sense and amplify data read by the activated word line WL in the first to fourth bank arrays 200*a*, 200*b*, 200*c*, and 200*d*. When the activated word line WL corresponds to the refresh row address REF_ADDR, the amplified data may be provided to the memory cell MC, restored in a cell capacitor, and refreshed. When the activated word line WL corresponds to the row address ROW_ADDR, the sense-amplified read data may be provided to the memory controller 100 through a data input/output (I/O) buffer and a data (DQ) bus.

The first to fourth bank arrays 200*a*, 200*b*, 200*c*, and 200*d*, the first to fourth bank row decoders 260*a*, 260*b*, 260*c*, and 260*d*, and the first to fourth bank sense amplifiers 270*a*, 270*b*, 270*c*, and 270*d* may constitute first to fourth banks BANK0, BANK1, BANK2, and BANK3, respectively. Although the memory device 120 including four banks is illustrated as an example in the present embodiment, in some embodiments, the memory device 120 may include an arbitrary number of banks.

The command decoder 230 may receive a command CMD from the memory controller 100 and generate control signals corresponding to the command CMD. The command decoder 230 may generate a refresh request signal REF_REQ in response to a refresh command REF_CMD of the memory controller 100. The refresh request signal REF_REQ may be provided to the refresh control circuit 220 to generate the refresh row address REF_ADDR. The refresh command REF_CMD may be regularly issued at a base refresh rate tREFi defined in the JEDEC standard. The base refresh rate tREFi, may be defined as a number (e.g., 8K) of refresh commands performed in a 32-ms refresh window. Thus, the refresh request signal REF_REQ may also be generated at the base refresh rate tREFi or a base refresh period. In the following embodiments, the base refresh rate tREFi and the base refresh period may be used interchangeably.

The row address multiplexer 250 may receive the row address ROW_ADDR from the address buffer 240 and receive the refresh row address REF_ADDR from a refresh address generator 222. The row address multiplexer 250 may selectively output the row address ROW_ADDR or the refresh row address REF_ADDR in response to the refresh request signal REF_REQ. The row address multiplexer 250 may select the refresh row address REF_ADDR and provide the refresh row address REF_ADDR to the row decoder 260 when the refresh request signal REF_REQ is enabled, and select the row address ROW_ADDR and provide the row address ROW_ADDR to the row decoder 260 when the refresh request signal REF_REQ is disabled. For example, the refresh request signal REF_REQ may be enabled when a command received by the command decoder 230 is a refresh command REF_CMD and disabled when the command is something other than the refresh command REF_CMD like a read or write command.

The temperature sensor 210 may measure a temperature of the memory device 120 and provide the measured temperature as temperature information to the refresh control circuit 220. Although the present embodiment describes a case in which the temperature sensor 210 is located in the memory device 120, the temperature sensor 210 may be outside the memory device 120 and measure the temperature of the memory device 120.

The mode register 212 provides various operation parameters and control parameters used to set operating conditions for the memory device 120. The mode register 212 may be programmed to set a plurality of operation parameters, options, various functions, characteristics, and modes of the memory device 120. The mode register 212 may store parameter code including appropriate bit values provided to the CA bus of the memory bus 110 when an MRS command is issued by the memory controller 100.

The mode register 212 may store refresh parameter code related to a refresh operation. The mode register 212 may store the number n of skipped base refresh rates tREFi in association with a pulling-in refresh command. In addition, the mode register 212 may store parameter code used to control a burst length, read/write latency, preamble/postamble lengths, write leveling enable/disable, a decision feedback equalization (DFE) quantity, pull-down/on-die termination (ODT) and pull-up/output high level voltage (Voh) calibration, pre-emphasis, and reference voltage setting.

The refresh control circuit 220 may control a refresh operation performed on the memory cell array 200, based on the temperature measured by the temperature sensor 210. In an embodiment, the refresh control circuit 220 includes the refresh address generator 222 and the temperature register 224. The temperature register 224 may store the temperature information provided by the temperature sensor 210. The refresh address generator 222 may generate a variable number of refresh row addresses REF_ADDR according to the temperature information stored in the temperature register 224, based on the refresh request signal REF_REQ at each base refresh rate tREFi.

The refresh address generator 222 may generate, for example, M (M is a natural number) refresh row addresses REF_ADDR when the temperature information of the temperature register 224 indicates a reference temperature. In an exemplary embodiment, the reference temperature is room temperature. During the base refresh period tREFi, M memory cell rows corresponding to M refresh row addresses REF_ADDR are refreshed. In some embodiments, M may be set to about 4.

When the temperature information of the temperature register 224 indicates a hot temperature higher than the reference temperature, the refresh address generator 222 may generate, for example, 2M refresh row addresses REF_ADDR. During the base refresh period tREFi, 2M memory cell rows corresponding to 2M refresh row addresses REF_ADDR are refreshed. In an exemplary embodiment, during the base refresh period tREFi, a refresh period of each of the 2M memory cell rows that are refreshed at the hot temperature is shorter than a refresh period of each of the M memory cell rows that are refreshed at the reference temperature.

When the temperature information of the temperature register 224 indicates a cold temperature lower than the reference temperature, the refresh address generator 222 generates (½)M refresh row addresses REF_ADDR. During the base refresh period tREFi, (½)M memory cell rows corresponding to (½)M refresh row addresses REF_ADDR are refreshed. In an embodiment, during the base refresh period tREFi, a refresh period of each of (½)M memory cell rows that are refreshed at the cold temperature are longer than the refresh period of each of the M memory cell rows that are refreshed at the reference temperature.

The refresh command REF_CMD may be expected to be regularly applied to the memory device 120 at each base refresh rate tREFi. However, to improve scheduling and/or switching efficiency between tasks, the memory controller 100 may issue the refresh command REF_CMD after skipping some refresh commands REF_CMD. The refresh control circuit 220 may count the number n (n is a natural number) of skipped refresh commands REF_CMD. The refresh address generator 222 may generate (n+1)*M refresh row addresses REF_ADDR based on the refresh command REF_CMD applied after the n skipped refresh command(s). Accordingly, in response to the refresh command REF_CMD applied after the n skipped refresh command(s), (n+1)*M memory cell rows corresponding to (n+1)*M refresh row addresses REF_ADDR may be refreshed during the base refresh period tREFi. For example, if M is 10, n is 1, and the temperature is a hot temperature, one previously issued refresh command not yet executed could be skipped and then 20 rows addresses could be refreshed during the base refresh period tREFi.

In addition, the memory controller 100 may skip some refresh commands REF_CMD by pulling in the refresh commands REF_CMD to improve scheduling and/or switching efficiency between tasks. The refresh control circuit 220 may count the number n of refresh commands REF_CMD to be skipped after a pulling-in refresh command REF_CMD (refer to 1020 in FIG. 10B). The refresh address generator 222 may generate (n+1)*M refresh row addresses REF_ADDR in response to the pulling-in refresh command REF_CMD. Thus, the (n+1)*M memory cell rows corresponding to the (n+1)*M refresh row addresses REF_ADDR may be refreshed during the base refresh period tREFi at the time when the pulling-in refresh command REF_CMD is applied.

Figure 3:
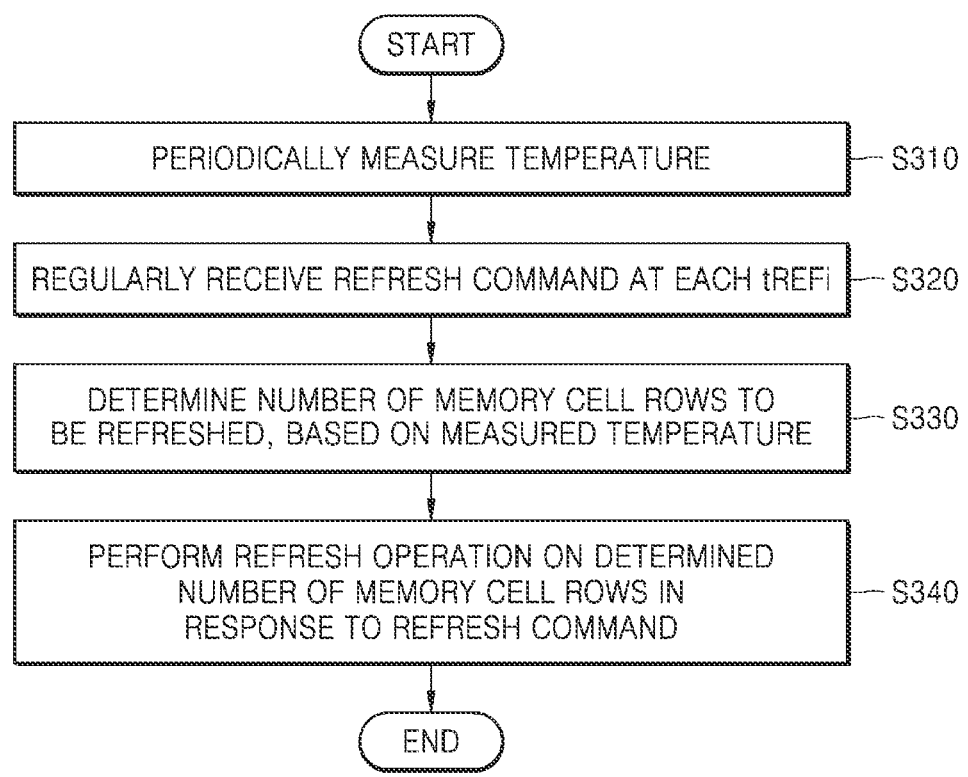
FIG. 3 is a flowchart of an example of a refresh operation of a memory device according to an exemplary embodiment of the inventive concept.

FIG. 3 is a flowchart of an example of a refresh operation of the memory device 120 according to an exemplary embodiment of the inventive concept.

Referring to FIGS. 1, 2, and 3, in operation S310, the memory device 120 periodically measures a temperature of the memory device 120 by using the temperature sensor 210. For example, the measured temperature may be provided to the refresh control circuit 220 as temperature information, which may be identified as a reference temperature (or room temperature), a high temperature (inclusively referred to as a hot temperature), or a low temperature (inclusively referred to as a cold temperature).

In operation S320, the memory device 120 regularly receives a refresh command REF_CMD at each base refresh rate tREFi. The base refresh rate tREFi may be set to, for example, about 3.9 μs. In this case, the memory controller 100 does not need to vary the base refresh rate tREFi according to a refresh rate multiplier, which is expressed as a function of a DRAM temperature specified in a JEDEC standard. For example, if the base refresh rate tREFi is set to 3.9 μs, the memory device 120 would receive a single refresh command every 3.9 μs.

In operation S330, the memory device 120 determines the number of memory cell rows to be refreshed, based on the measured temperature. As an example, the memory device 120 may determine M memory cell rows when the measured temperature is the reference temperature or room temperature, determine 2M memory cell rows when the measured temperature is a hot temperature higher than the reference temperature, and determine (½)M memory cell rows when the measured temperature is a cold temperature lower than the reference temperature.

In operation S340, the memory device 120 performs a refresh operation on memory cell rows of which the number is determined in operation S330, in response to the refresh command REF_CMD.

At the reference temperature, the memory device 120 refreshes M memory cell rows during the base refresh period tREFi in response to the refresh command REF_CMD.

At the hot temperature, the memory device 120 refreshes 2M memory cell rows during the base refresh period tREFi in response to the refresh command REF_CMD. In an exemplary embodiment, at the hot temperature, each of the 2M memory cell rows are refreshed at a shorter period than a refresh period of each of the M memory cell rows at the reference temperature. As a result, the refresh rate may be increased to prevent data loss as the temperature of the memory device 120 rises.

At the cold temperature, the memory device 120 refreshes (½)M memory cell rows during the base refresh period tREFi in response to the refresh command REF_CMD. In an exemplary embodiment, a refresh period of each of the memory cell rows refreshed at the cold temperature is longer than a refresh period of each of the memory cell rows refreshed at the reference temperature. As a result, the refresh rate may be reduced to prevent unnecessary power consumption when the temperature of the memory device 120 is reduced. In an embodiment, a refresh operation time taken to refresh only the (½)M memory cell rows at the cold temperature is shorter than a refresh operation time taken to refresh the M memory cell rows at the reference temperature, and thus, the benefit of minimizing an idle time of a system may be provided.

Figure 4:
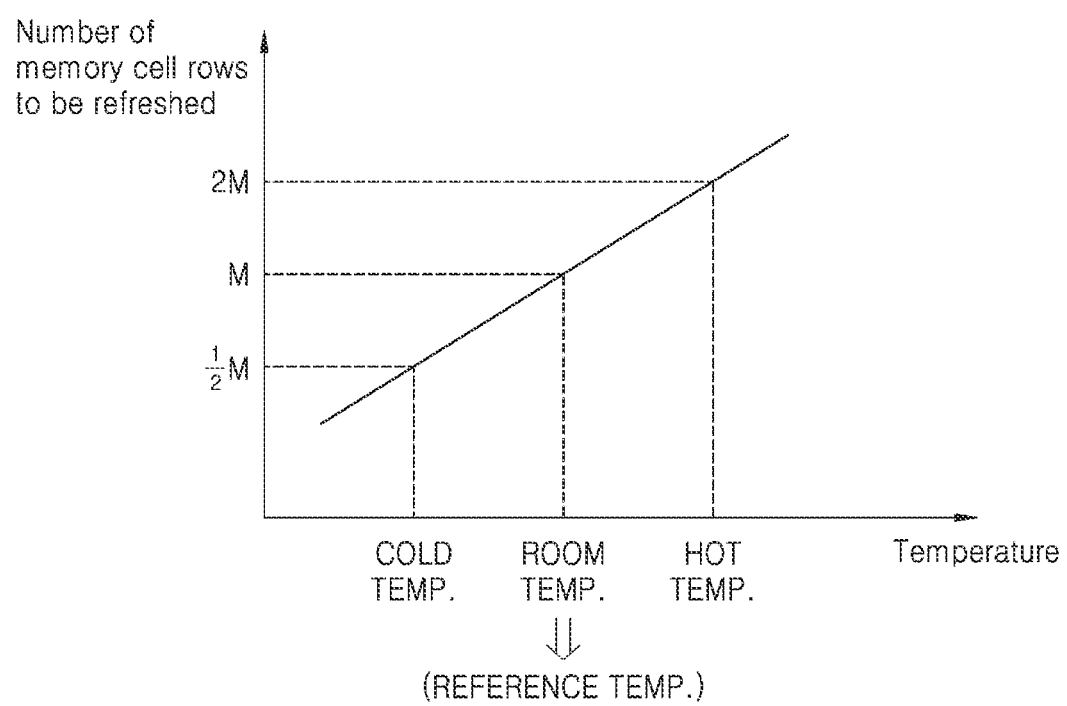
FIG. 4 is a graph for schematically illustrating that the number of memory cell rows to be refreshed adaptively varies according to temperature, according to an exemplary embodiment of the inventive concept.

FIG. 4 is a graph for schematically explaining that the number of memory cell rows to be refreshed adaptively varies according to a temperature, according to an embodiment of the inventive concept.

Referring to FIGS. 2 and 4, when a temperature measured by the temperature sensor 210 is a reference temperature or a room temperature, the refresh control circuit 220 may set M memory cell rows to be refreshed. When the temperature measured by the temperature sensor 210 is a hot temperature, the refresh control circuit 220 may set 2M memory cell rows to be refreshed. When the temperature measured by the temperature sensor 210 is a cold temperature, the refresh control circuit 220 may set (½)M memory cell rows to be refreshed.

Figures 5, 6, 7:
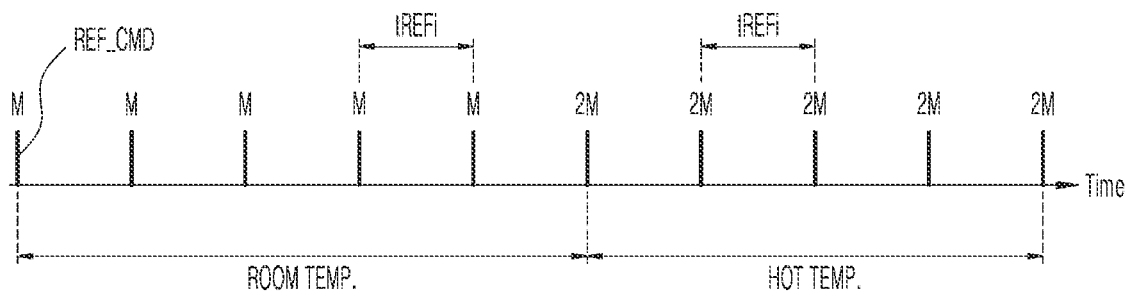
FIGS. 5 to 7 are timing diagrams illustrating a refresh operation according to an exemplary embodiment of the inventive concept.

FIGS. 5 to 7 are timing diagrams illustrating refresh operations according to embodiments. FIGS. 5 and 6 illustrate refresh operations performed based on the flowchart of FIG. 3. FIG. 7 corresponds to a comparative example of FIGS. 5 and 6 and illustrates a refresh rate, which varies according to a refresh rate multiplier that is expressed as a function of a DRAM temperature specified in a JEDEC standard.

Referring to FIGS. 2 to 6, the memory device 120 periodically measures a temperature of the memory device 120 by using the temperature sensor 210 and regularly perform a refresh operation at each base refresh rate tREFi. When the temperature measured by the temperature sensor 210 is a reference temperature (e.g., a room temperature), the memory device 120 refreshes M memory cell rows at each base refresh rate tREFi as shown in FIG. 5. When the temperature measured by the temperature sensor 210 is a hot temperature, the memory device 120 refreshes 2M memory cell rows at each base refresh rate tREFi. When the temperature measured by the temperature sensor 210 is a cold temperature, the memory device 120 refreshes (½)M memory cell rows at each base refresh rate tREFi as shown in FIG. 6.

When the temperature measured by the temperature sensor 210 is changed, power consumption may vary at the base refresh rate tREFi. In FIG. 5, when the measured temperature is changed from the room temperature to a hot temperature, power consumed to refresh 2M memory cell rows at the base refresh rate tREFi at the hot temperature may vary more than power consumed to refresh the M memory cell rows at the base refresh rate tREFi at the room temperature. In FIG. 6, when the measured temperature is changed from the room temperature to the cold temperature, power consumed to refresh (½)M memory cell rows at the base refresh rate tREFi at the cold temperature may vary less than power consumed to refresh the M memory cell rows at the base refresh rate tREFi at the room temperature.

FIG. 7 shows that a refresh rate varies due to the refresh rate multiplier expressed as a function of a DRAM temperature defined in the JEDEC standard. For example, a refresh rate at the hot temperature may be set to (½)tREFi, which corresponds to half of the base refresh rate tREFi at the room temperature. Accordingly, because a clock rate is adjusted in association with the refresh rate of (½)tREFi, this may increase the burden of scheduling and/or switching operations between tasks of a system.

FIG. 8 is a flowchart of an example of a refresh operation of a memory device according to an exemplary embodiment of the inventive concept.

Referring to FIGS. 1, 2, and 8, in operation S810, the memory device 120 regularly receives a refresh command REF_CMD from the memory controller 100 at each base refresh rate tREFi. The base refresh rate tREFi may be set to, for example, about 3.9 μs, but is not limited thereto.

In operation S820, the memory device 120 receives the refresh command REF_CMD applied after skipped refresh command(s). The refresh command REF_CMD is received after an arbitrary number n (n is a natural number) of base refresh rates tREFi are skipped. The memory controller 100 may manage scheduling and/or switching operations between tasks during the n base refresh rates tREFi that are skipped. In an embodiment, the memory controller 100 performs a task other than refreshing memory when the n base refresh rates tREFi are skipped.

In operation S830, the memory device 120 determines the number of memory cell rows to be refreshed, based on the refresh command REF_CMD applied after the skipped refresh command(s). The memory device 120 may determine (n+1)*M memory cell rows, based on the refresh command REF_CMD applied after the skipped refresh command(s).

In operation S840, the memory device 120 refreshes the determined number of memory cell rows, based on the refresh command REF_CMD applied after the skipped refresh command(s). The memory device 120 may refresh the (n+1)*M memory cell rows during the base refresh period tREFi in response to the refresh command REF_CMD applied after the skipped refresh command(s).

FIG. 9 is a timing diagram illustrating refresh operations performed based on the flowchart of FIG. 8.

Referring to FIGS. 2, 8, and 9, the memory device 120 refreshes M memory cell rows at each base refresh rate tREFi. The memory device 120 may receive a refresh command 901 from the memory controller 100 after three base refresh rates tREFi are skipped (as illustrated with dashed lines). In an embodiment, the memory controller 100 refrains from sending the refresh command to the memory device 120 for a period corresponding to the three base refresh rates tREFi after periodically sending the refresh command to the memory device. The memory device 120 may determine (3+1)*M=4M memory cell rows based on the refresh command 901 applied after the three skipped base refresh rates tREFi. The refresh command 901 may be applied to the memory device 120 at the time of the base refresh rate tREFi. The memory device 120 may refresh 4M memory cell rows during the base refresh rate tREFi in response to the refresh command 901 applied after the three skipped base refresh rates tREFi. In this case, power consumption at the base refresh rate tREFi in response to the refresh command 901 applied after the base refresh rates tREFi are skipped may increase. The memory device 120 may refresh M memory cell rows at each base refresh rate tREFi after refreshing 4M memory cell rows in response to the refresh command 901 applied after the base refresh rates tREFi are skipped. In an embodiment, the memory device 120 includes a counter, and the memory device 120 uses the counter to count the number n of times it does not receive a refresh command after periodically receiving a refresh command to determine the number (n+1)*M of memory cells to refresh after the prior refresh skip.

Figure 10A:
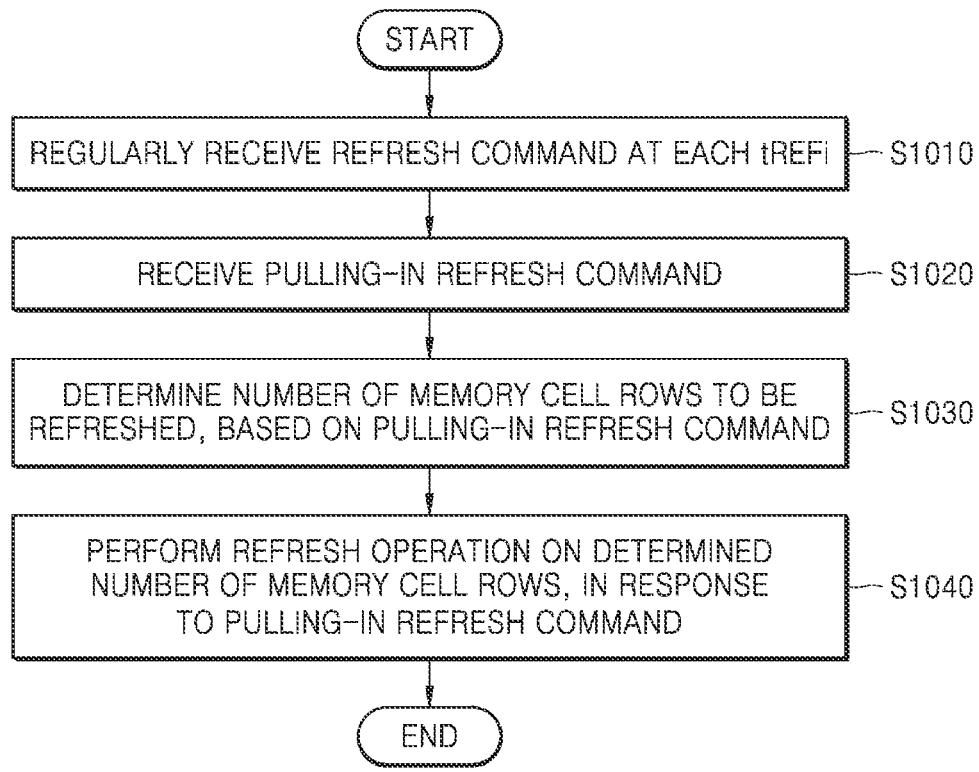
FIGS. 10A and 10B are diagrams illustrating a refresh operation of a memory device, according to an exemplary embodiment of the inventive concept.
Figure 10B:
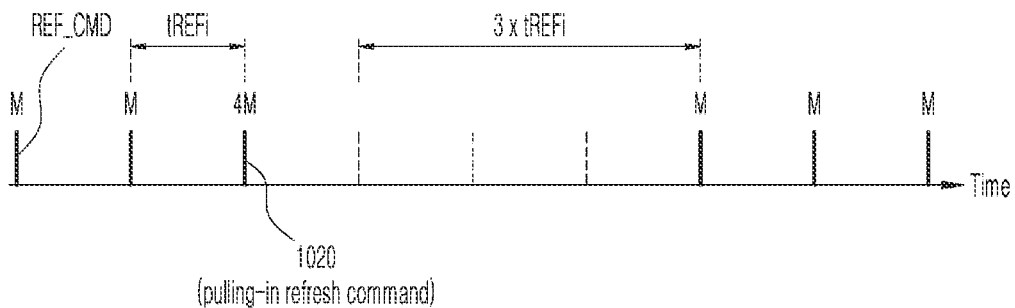

FIGS. 10A and 10B are diagrams illustrating a refresh operation of a memory device, according to an exemplary embodiment of the inventive concept. A refresh operation based on a pulling-in refresh command REF_CMD applied at a base refresh rate tREFi will be described with reference to FIGS. 10A and 10B.

Referring to FIGS. 1, 2, and 10A, in operation S1010, the memory device 120 regularly receives a refresh command REF_CMD at each base refresh rate tREFi. The base refresh rate tREFi may be set to, for example, about 3.9 μs, but is not limited thereto.

In operation S1020, the memory device 120 receives the pulling-in refresh command 1020 for the base refresh rate tREFi. For example, the memory 120 may receive from the pulling-in refresh command 1020 from the memory controller 100. After the pulling-in refresh command 1020 is received, an arbitrary number n (n is a natural number) of base refresh rates tREFi may be skipped. The memory controller 100 may manage scheduling and/or switching operations between tasks during the n base refresh rates tREFi to be skipped.

In operation S1030, the memory device 120 determines the number of memory cell rows to be refreshed, based on the pulling-in refresh command 1020. The memory device 120 may determine (n+1)*M memory cell rows, based on the pulling-in refresh command 1020. In an embodiment, the value of n is stored in the pull-in refresh command 1020, the value of M is pre-stored in memory device 120 or accessible to the memory device, and the memory device calculated the number of memory cell rows to refresh based on the values.

In operation S1040, the memory device 120 refreshes memory cell rows of which the number is determined based on the pulling-in refresh command 1020. The memory device 120 may refresh the (n+1)*M memory cell rows during the base refresh period tREFi in response to the pulling-in refresh command 1020.

Referring to FIG. 10B, the memory device 120 may refresh M memory cell rows at each base refresh rate tREFi. After the memory device 120 receives the pulling-in refresh command 1020, n (e.g., n=3) base refresh rates tREFi may be skipped (as illustrated with dashed lines). In response to the pulling-in refresh command 1020, the memory device 120 may set the number n of base refresh rates tREFi to be skipped, to bit values of some (e.g., 3 bits) of bits included in a refresh command. For example, some of the bits may indicate the value of n. In some embodiments, in response to the pulling-in refresh command 1020, the memory device 120 may set the number of base refresh rates tREFi to be skipped, in association with refresh parameter code stored in a mode register 212. For example, the value of n and/or the value of M may be stored in the refresh parameter code. In an embodiment, the pulling-in refresh command 1020 is applied to the memory device 120 at the base refresh rate tREFi. In some embodiments, the memory device 120 may receive the number n of base refresh rate tREFi to be skipped, along with a dedicated pulling-in refresh command 1020 from the memory controller 100.

The memory device 120 may determine (3+1)*M=4M memory cell rows, based on the pulling-in refresh command 1020. The memory device 120 may refresh 4M memory cell rows during the base refresh period tREFi in response to the pulling-in refresh command 1020. In this case, power consumption at the base refresh rate tREFi in response to the pulling-in refresh command 1020 may be increased. The memory device 120 may refresh M memory cell rows at each base refresh rate tREFi after refreshing 4M memory cell rows in response to the pulling-in refresh command 1020.

Figure 11A:
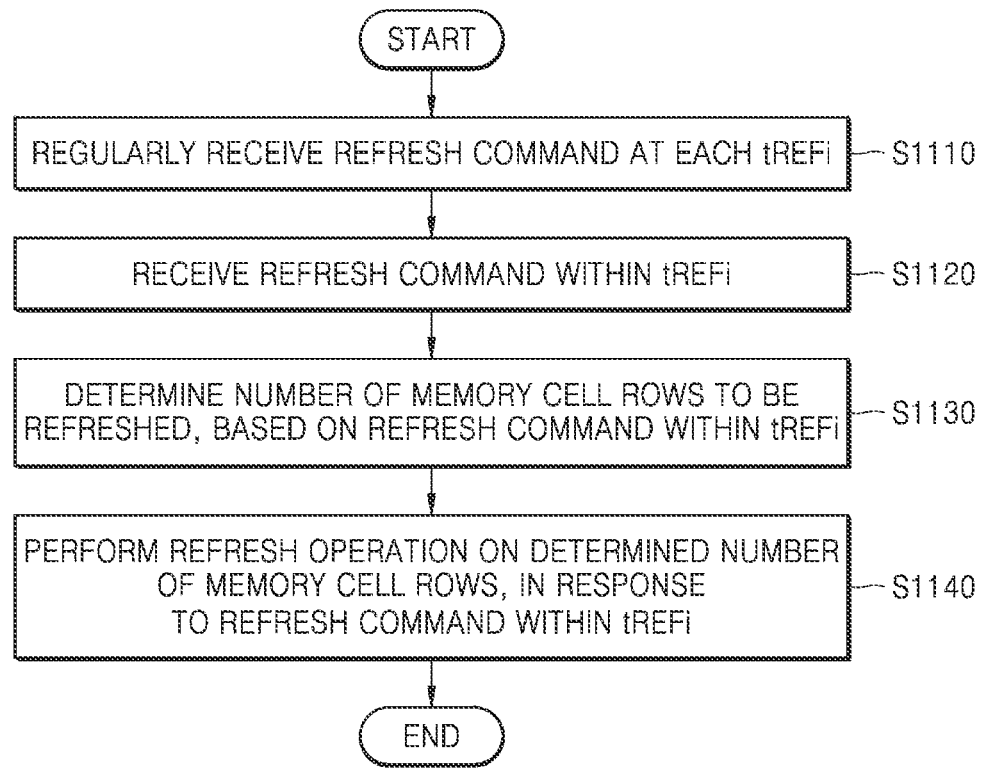
FIGS. 11A and 11B are diagrams for explaining a refresh operation of a memory device, according to an exemplary embodiment of the inventive concept.
Figure 11B:
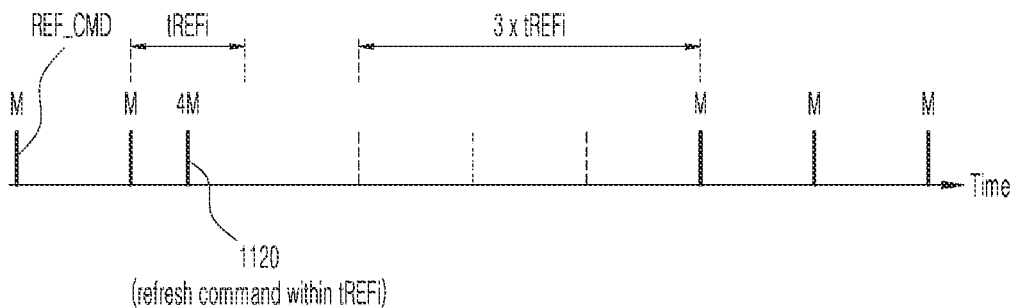

FIGS. 11A and 11B are diagrams for explaining a refresh operation of a memory device, according to an exemplary embodiment of the inventive concept. A refresh operation in response to a refresh command REF_CMD applied within a base refresh rate tREFi will be described with reference to FIGS. 11A and 11B.

Referring to FIGS. 1, 2, and 11A, in operation S1110, the memory device 120 regularly receives the refresh command REF_CMD at each base refresh rate tREFi. The base refresh rate tREFi may be set to, for example, about 3.9 μs, but is not limited thereto.

In operation S1120, the memory device 120 receives the refresh command REF_CMD within the base refresh rate tREFi. For example, the memory controller 100 may send out a single refresh command REF_CMD to the memory device 120 at a base refresh rate rREFi for several base refresh periods and then on occasion send out an extra refresh command REF_CMD within one of the base refresh periods to cause the refresh skipping. For example, the memory controller could send out refresh commands at time 0, at time 3.9 μs, at time 7.8 μs to cause the normal refreshing, and then at time 9 μs to trigger the refresh skipping. In an embodiment, in response to the refresh command REF_CMD within the base refresh rate tREFi, the memory device 120 sets the number n of base refresh rates tREFi to be skipped, in association with a refresh parameter code stored in the mode register 212. Accordingly, when the refresh command REF_CMD is received within the base refresh rate tREFi, n base refresh rates tREFi are skipped. The memory controller 100 may manage scheduling and/or switching operations between tasks during the n base refresh rates tREFi to be skipped.

In operation S1130, the memory device 120 determines the number of memory cell rows to be refreshed, based on the refresh command REF_CMD received within the base refresh rate tREFi. The memory device 120 may determine (n+1)*M memory cell rows, based on the refresh command REF_CMD received within the base refresh rate tREFi. For example, the memory device 120 may include a counter and use the counter to determine whether it has received a refresh command within a base refresh rate tREFi.

In operation S1140, the memory device 120 refreshes memory cell rows of which the number is determined based on the refresh command REF_CMD received within the base refresh rate tREFi. The memory device 120 may refresh (n+1)*M memory cell rows during the base refresh period tREFi, in response to the refresh command REF_CMD received within the base refresh rate tREFi.

Referring to FIG. 11B, the memory device 120 refreshes M memory cell rows at each base refresh rate tREFi. The memory device 120 may receive a refresh command 1120 within the base refresh rate tREFi. When the refresh command 1120 is received within the base refresh rate tREFi, the memory device 120 may set the number n of base refresh rate tREFi to be skipped after the refresh command 1120. The number n of base refresh rates tREFi to be skipped after the refresh command 1120 may be predefined in connection with a refresh operation between the memory controller 100 and the memory device 120. As an example, the number n of base refresh rates tREFi to be skipped after the refresh command 1120 may be provided as refresh parameter code stored in the mode register 212.

The memory device 120 may determine (3+1)*M=4M memory cell rows, based on the refresh command 1120 within the base refresh rate tREFi. The memory device 120 may refresh 4M memory cell rows in response to the refresh command 1120 within the base refresh rate tREFi. After refreshing the 4M memory cell rows in response to the refresh command 1120 within the base refresh rate tREFi, the memory device 120 may refresh M memory cell rows at each base refresh rate tREFi in response to a refresh command applied after the refresh command 1120 within the base refresh rate tREFi.

Figure 12:
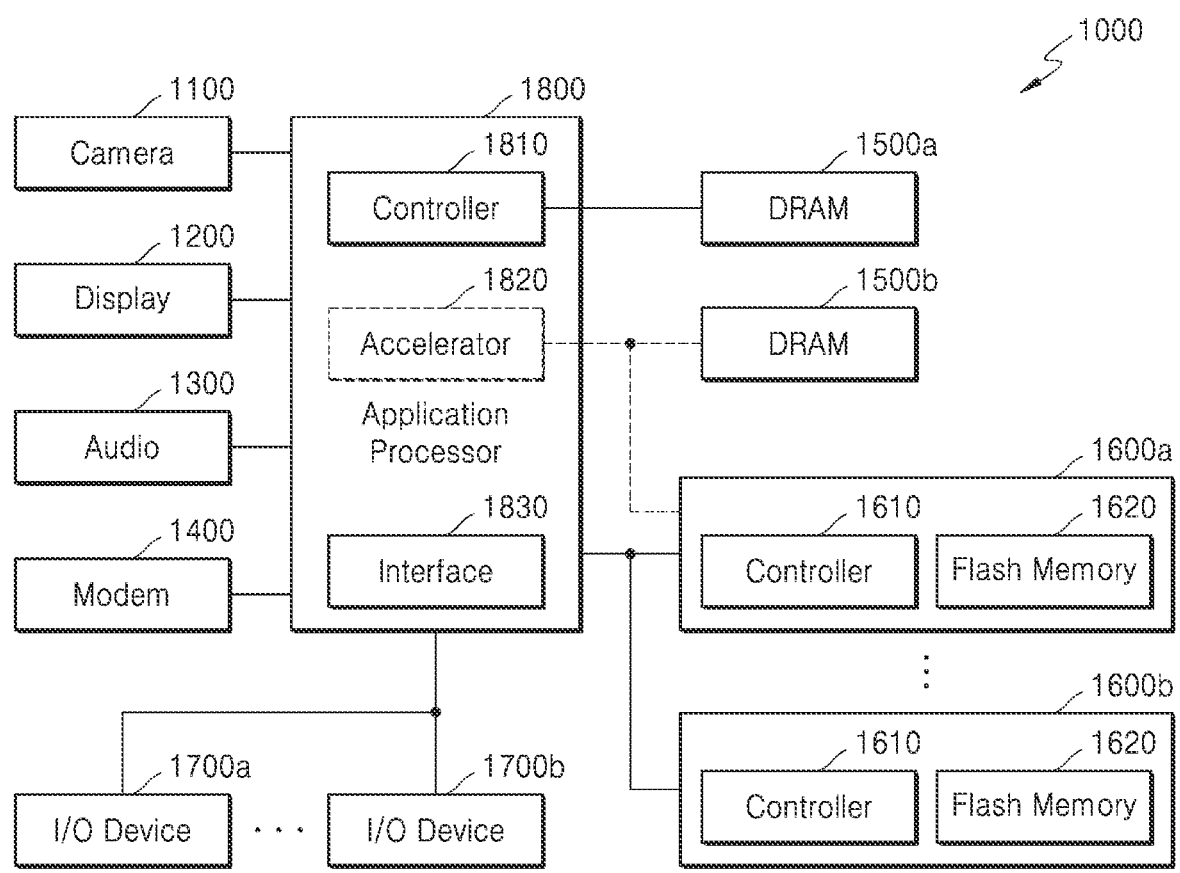
FIG. 12 is a block diagram of an exemplary system to which a memory device according to an exemplary embodiment is applied.

FIG. 12 is a block diagram of a system 1000 to which a memory device according to an exemplary embodiment is applied.

Referring to FIG. 12, the system 1000 includes a camera 1100, a display 1200, an audio processor 1300, a modem 1400, DRAMs 1500a and 1500b, storage devices 1600a and 1600b, I/O devices 1700a and 1700b, and an application processor (hereinafter, AP) 1800. The system 1000 may be implemented as a laptop computer, a mobile phone, a smartphone, a tablet personal computer (PC), a wearable device, a healthcare device, or an Internet of Things (IoT) device. In addition, the system 1000 may be implemented as a server or a personal computer.

The camera 1100 may capture a still image or a moving image via the user's control and store the captured image and image data or transmit the captured image and the image data to the display 1200. The audio processor 1300 may process audio data included in contents of the flash memory devices 1600a and 1600b or a network. To transmit and receive wired/wireless data, the modem 1400 may modulate and transmit a signal and demodulate the modulated signal to restore the modulated signal to an original signal at a receiving side. The I/O devices 1700a and 1700b may include devices configured to provide digital input and/or output functions, such as a universal serial bus (USB), a storage, a digital camera, a secure digital (SD) card, a digital versatile disc (DVD), a network adaptor, and a touch screen.

The AP 1800 may control all operations of the system 1000. The AP 1800 may control the display 1200 such that some of the contents stored in the flash memory devices 1600a and 1600b are displayed on the display 1200. The AP 1800 may perform a control operation corresponding to a user's input when the AP 1800 receives the user's input through the I/O devices 1700a and 1700b. The AP 1800 may include an accelerator block, which is a dedicated circuit for an artificial intelligence (AI) data operation, or an accelerator chip 1820 may be provided separately from the AP 1800. The DRAM 1500b may be further mounted in the accelerator block or the accelerator chip 1820. The accelerator block may be a dedicated function block for a specific function of the AP 1800 and include a graphics processing unit (GPU), a neural processing unit (NPU), and a data processing unit (DPU). The GPU may be a dedicated function block configured to process graphics data, the NPU may be a dedicated block configured to perform AI calculations and inference, and the DPU may be a dedicated block configured to transmit data.

The system 1000 may include a plurality of DRAMs (e.g., 1500a and 1500b) and a memory controller 1810 configured to control the DRAMs 1500a and 1500b. The AP 1800 may control the DRAMs 1500a and 1500b by using commands and mode register set (MRS) signals that conform to the JEDEC standard, or may communicate with the DRAMs 1500a and 1500b by setting a DRAM interface protocol to use enterprise-specific functions (e.g., low voltage/high speed/reliability) and cyclic redundancy check (CRC)/error correction code (ECC) functions. For example, the AP 1800 may communicate with the DRAM 1500a via an interface (e.g., LPDDR4 and LPDDR5) that conforms to the JEDEC standard. To control the DRAM 1500b for an accelerator, which has a higher bandwidth than the DRAM 1500a, the accelerator block or the accelerator chip 1820 may communicate with the DRAM 1500b by setting a new DRAM interface protocol.

Although only the DRAMs 1500a and 1500b are illustrated in FIG. 12, the inventive concept is not limited thereto. Any memory, such as phase-change RAM (PRAM), static RAM (SRAM), magnetic RAM (MRAM), resistive RAM (RRAM), ferroelectric RAM (FRAM), or hybrid RAM, may be used if bandwidth, reaction rate, and voltage requirements for the AP 1800 or the accelerator chip 1820 are satisfied. The DRAMs 1500a and 1500b may have less latency and bandwidths than the I/O devices 1700a and 1700b or the flash memories 1600a, 1600b. Each of the DRAMs 1500a and 1500b may be initialized at the time when the system 1000 is powered on. The DRAMs 1500a and 1500b may be used as temporary storages in which an operating system and application data are loaded, or used as execution spaces for various software codes.

Addition/subtraction/multiplication/division operations, vector operations, address operations, or fast Fourier Transform (FFT) operations may be performed in the DRAMs 1500a and 1500b. In addition, an operation for a function used for inference may be performed in the DRAMs 1500a and 1500*b*. Here, the inference may be performed in a deep learning algorithm using an artificial neural network. The deep learning algorithm may include a training operation of training a model using various pieces of data and an inference operation of recognizing data based on the trained model. As an embodiment, an image captured by the user through the camera 1100 may be signal-processed and stored in the DRAM 1500*b*. The accelerator block or the accelerator chip 1820 may perform an AI data operation for recognizing data by using data stored in the DRAM 1500*b* and a function used for inference.

The system 1000 may include a plurality of storages or a plurality of flash memories (e.g., 1600*a* and 1600*b*), which have a larger capacity than the DRAMs 1500*a* and 1500*b*. The storage devices 1600*a* and 1600*b* may include memory controllers 1610 and flash memory (NVM) 1620 storing data under the control of the memory controllers 1610, respectively. The accelerator block or the accelerator chip 1820 may perform a training operation and an AI data operation by using the flash memory devices 1600*a* and 1600*b*. In one embodiment, the storage devices 1600*a* and 1600*b* may enable the AP 1800 and/or the accelerator chip 1820 to perform the training operation and an inference AI data operation efficiently by using a computing device included in a memory controller 1610. Each of the storage devices 1600*a* and 1600*b* may store an image captured by the camera 1100 or store received through a data network. For example, each of the flash memories 1600*a* and 1600*b* may store augmented reality/virtual reality contents and/or high definition (HD) or ultra-high definition (UHD) contents.

Each of the DRAMs 1500*a* and 1500*b* may include the memory device 120 described with reference to FIGS. 1 to 11. Each of the DRAMs 1500*a* and 1500*b* may measure a temperature, regularly receive a refresh command at each base refresh rate tREFi, and change the number of memory cell rows to be refreshed, during a base refresh period associated with the base refresh rate tREFi, based on the measured temperature. In an embodiment, in response to the refresh command at each base refresh rate tREFi, each of the DRAMs 1500*a* and 1500*b* refresh M memory cell rows at room temperature, refresh more than M memory cell rows (e.g., 2M) memory cell rows at a hot temperature, and refresh less than M (e.g., (½)M) memory cell rows at a cold temperature. In an exemplary embodiment, each of the DRAMs 1500*a* and 1500*b* receives a refresh command at a next base refresh rate after n (n is a natural number) base refresh rates are skipped, refresh (n+1)*M memory cell rows in response to a refresh command applied after the n skipped base refresh rates, and refresh M memory cell rows in response to a refresh command at each base refresh rate after the refresh command applied after the n skipped base refresh rates. In an embodiment, each of the DRAMs 1500*a* and 1500*b* receive a pulling-in refresh command, skip n base refresh rates after the pulling-in refresh command, refresh (n+1)*M memory cell rows in response to the pulling-in refresh command, and refresh M memory cell rows in response to a refresh command at each base refresh rate after the pulling-in refresh command. In an embodiment, the memory controller 1810 does not vary the base refresh rate according to a refresh rate multiplier based on the temperatures of the DRAMs 1500*a* and 1500*b*.

A memory device according to an exemplary embodiment may adaptively change the number of memory cell rows to be refreshed, according to a temperature, in response to a refresh command applied at a base refresh rate tREFi. Accordingly, because a memory controller configured to control a refresh operation on the memory device does not need to change a refresh period according to a refresh rate multiplier that is based on a temperature, system performance may be improved by reducing the burden of a scheduling operation. Furthermore, the memory device may adaptively change the number of memory cell rows to be refreshed, in response to a refresh command applied after a pulling-in refresh command or skipped refresh command(s), which are provided by the memory controller.

While the inventive concept has been particularly shown and described with reference to embodiments thereof, it will be understood that various changes in form and details may be made therein without departing from the spirit and scope of the following claims.

What is claimed is:

1. A memory system comprising:
a memory controller configured to periodically output a refresh command at a base refresh rate; and
a memory device comprising:
a memory cell array comprising a plurality of memory cell rows; and
a refresh control circuit configured to perform a refresh operation on the plurality of memory cell rows in response to the refresh command, the refresh control circuit being configured to regularly receive the refresh command at the base refresh rate,
wherein the refresh control circuit determines a number of memory cell rows to be refreshed based on a temperature of the memory device, and refreshes the determined number of memory cell rows from among the plurality of memory cell rows, during a base refresh period associated with the base refresh rate, in response to the refresh command, and
wherein the memory controller does not vary the base refresh rate based on the temperature of the memory device.

2. The memory system of claim 1, wherein the refresh control circuit sets the number of memory cell rows to be refreshed to M when the temperature of the memory device is a reference temperature, and sets the number of memory cell rows to be refreshed to be more than M when the temperature of the memory device is a high temperature higher than the reference temperature, where M is a natural number.

3. The memory system of claim 2, wherein the refresh control circuit sets the number of memory cell rows to be refreshed to 2M at the high temperature.

4. The memory system of claim 1, wherein the refresh control circuit sets the number of memory cell rows to be refreshed to M when the temperature of the memory device is a reference temperature, and sets the number of memory cell rows to be refreshed to be less than M when the temperature of the memory device is a low temperature lower than the reference temperature, where M is a natural number.

5. The memory system of claim 4, wherein the refresh control circuit sets the number of memory cell rows to be refreshed to (½)M at the low temperature.

6. The memory system of claim 1, the memory device further comprising a temperature sensor configured to measure the temperature of the memory device.

7. A memory device comprising:
a memory cell array comprising a plurality of memory cell rows; and
a refresh control circuit configured to perform a refresh operation on the plurality of memory cell rows in response to a refresh command, the refresh control circuit being configured to regularly receive the refresh command at a base refresh rate, wherein the refresh control circuit receives the refresh command at the base refresh rate applied after n number of refresh commands are skipped, determines the number of memory cell rows to be refreshed, based on the refresh command applied after the n number of refresh commands are skipped, and refreshes the determined number of memory cell rows, from among the plurality of memory cell rows, during a base refresh period associated with the base refresh rate, in response to the refresh command applied after the n number of refresh commands are skipped, wherein n is a natural number.

8. The memory device of claim 7, wherein the refresh control circuit sets the number of memory cell rows to be refreshed to M in response to the refresh command and determines (n+1)*M memory cell rows in response to the refresh command applied after the n number of refresh commands are skipped, wherein n is a natural number.

9. The memory device of claim 8, wherein the refresh control circuit refreshes the M memory cell rows at each base refresh rate after refreshing the (n+1)*M memory cell rows in response to the refresh command applied after the n number of refresh commands are skipped.

10. A memory device comprising:
a memory cell array comprising a plurality of memory cell rows; and a refresh control circuit configured to perform a refresh operation on the plurality of memory cell rows in response to a refresh command, the refresh control circuit being configured to regularly receive the refresh command at a base refresh rate,
wherein the refresh control circuit receives a pulling-in refresh command, skips n number of refresh commands after receiving the pulling-in refresh command, determines a number of the memory cell rows to be refreshed, in response to the pulling-in refresh command, and refreshes the determined number of memory cell rows, from among the plurality of memory cell rows, during a base refresh period associated with the base refresh rate, in response to the pulling-in refresh command, where n is a natural number.

11. The memory device of claim 10, wherein the refresh control circuit sets the number of memory cell rows to be refreshed to M in response to the refresh command, and determines (n+1)*M memory cell rows in response to the pulling-in refresh command, where M is a natural number.

12. The memory device of claim 11, wherein the refresh control circuit refreshes the M memory cell rows at the base refresh rate when the n number of refresh commands are skipped after receiving the pulling-in refresh command.

13. The memory device of claim 10, wherein the n number of refresh commands skipped is stored in a mode register of the memory device.

14. The memory device of claim 10, wherein n, which is the number of skipped base refresh rates, is included in the pulling-in refresh command and received by the refresh control circuit.

15. A memory device comprising:
a memory cell array comprising a plurality of memory cell rows; and
a refresh control circuit configured to perform a refresh operation on the plurality of memory cell rows in response to a refresh command, the refresh control circuit being configured to regularly receive the refresh command at a base refresh rate, wherein the refresh control circuit receives a refresh command at a base refresh rate, skips n number of refresh commands after receiving the refresh command, determines a number of memory cell rows to be refreshed based on the n number of refresh commands that are skipped, and refreshes the determined number of memory cell rows, from among the plurality of memory cell rows, during a base refresh period associated with the base refresh rate, in response to the refresh command, where n is a natural number.

16. The memory device of claim 15, wherein the refresh control circuit sets the number of memory cell rows to be refreshed to M in response to the refresh command, and determines (n+1)*M memory cell rows in response to the refresh command within the base refresh rate, where M is a natural number.

17. The memory device of claim 16, wherein the refresh control circuit refreshes the M memory cell rows at the base refresh rate when the n number of refresh commands are skipped after receiving the refresh command.

18. The memory device of claim 15, wherein the n number of refresh commands that are skipped is stored in a mode register of the memory device.

* * * * *